(12) United States Patent
Fujisaki et al.

(10) Patent No.: US 7,754,963 B2
(45) Date of Patent: Jul. 13, 2010

(54) SOLAR POWER GENERATION SYSTEM HAVING COOLING MECHANISM

(75) Inventors: Tatsuo Fujisaki, Nara (JP); Satoru Shiomi, Shizuoka (JP); Hidehisa Makita, Kyoto (JP); Shigenori Itoyama, Nara (JP)

(73) Assignee: Canon Kabushiki Kaisha, Tokyo (JP)

( * ) Notice: Subject to any disclaimer, the term of this patent is extended or adjusted under 35 U.S.C. 154(b) by 1303 days.

(21) Appl. No.: 10/924,839

(22) Filed: Aug. 25, 2004

(65) Prior Publication Data

US 2005/0016581 A1    Jan. 27, 2005

Related U.S. Application Data

(62) Division of application No. 09/986,487, filed on Nov. 9, 2001, now Pat. No. 6,806,415.

(30) Foreign Application Priority Data

Nov. 10, 2000    (JP) ............... 2000-343224

(51) Int. Cl.
*H02N 6/00*    (2006.01)
(52) U.S. Cl. .................. 136/246; 136/293
(58) Field of Classification Search .......... 136/248
See application file for complete search history.

(56) References Cited

U.S. PATENT DOCUMENTS

| | | | |
|---|---|---|---|
| 4,148,298 A | 4/1979 | Sherman, Jr. ............. 126/685 |
| 4,555,586 A | 11/1985 | Guha et al. ............. 136/259 |
| 6,080,927 A | 6/2000 | Johnson .................. 136/248 |
| 6,111,767 A * | 8/2000 | Handleman ............... 363/95 |
| 6,147,295 A | 11/2000 | Mimura et al. ............ 136/246 |
| 6,278,954 B1 * | 8/2001 | Lim et al. ................. 702/99 |
| 6,372,978 B1 | 4/2002 | Cifaldi ................... 136/248 |
| 6,806,415 B2 * | 10/2004 | Fujisaki et al. ........... 136/259 |
| 2002/0116928 A1 | 8/2002 | Fujisaki et al. ........... 60/641.8 |

FOREIGN PATENT DOCUMENTS

| | | |
|---|---|---|
| EP | 0 789 405 | 8/1997 |
| JP | 5-83881 | 4/1993 |
| JP | 7-36556 | 2/1995 |
| JP | 7-240532 | 9/1995 |
| JP | 9-213980 | 8/1997 |
| JP | 10-101268 | 4/1998 |

* cited by examiner

*Primary Examiner*—Alexa D Neckel
*Assistant Examiner*—Miriam Berdichevsky
(74) *Attorney, Agent, or Firm*—Fitzpatrick, Cella, Harper & Scinto

(57) ABSTRACT

A solar power generation system having a solar cell provided therein and which is provided with a cooling mechanism, characterized in that the cooling mechanism has a cooling system for cooling the solar cell and a memory and operation system for memorizing or operating an optimum cooling and driving state of the cooling system with respect to an output of the solar cell. The cooling system is driven based on an output of the memory and operation system.

7 Claims, 6 Drawing Sheets

F I G. 1
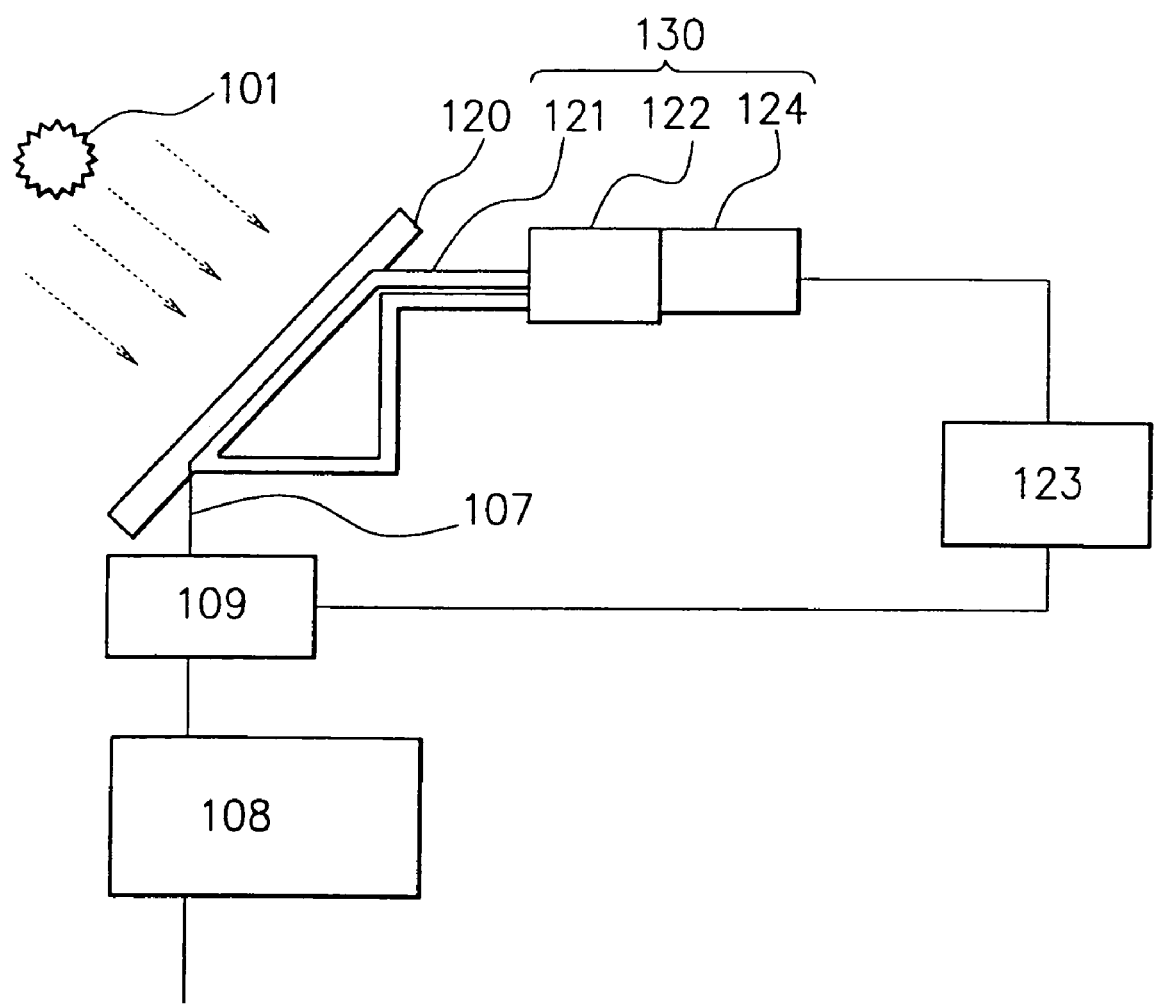

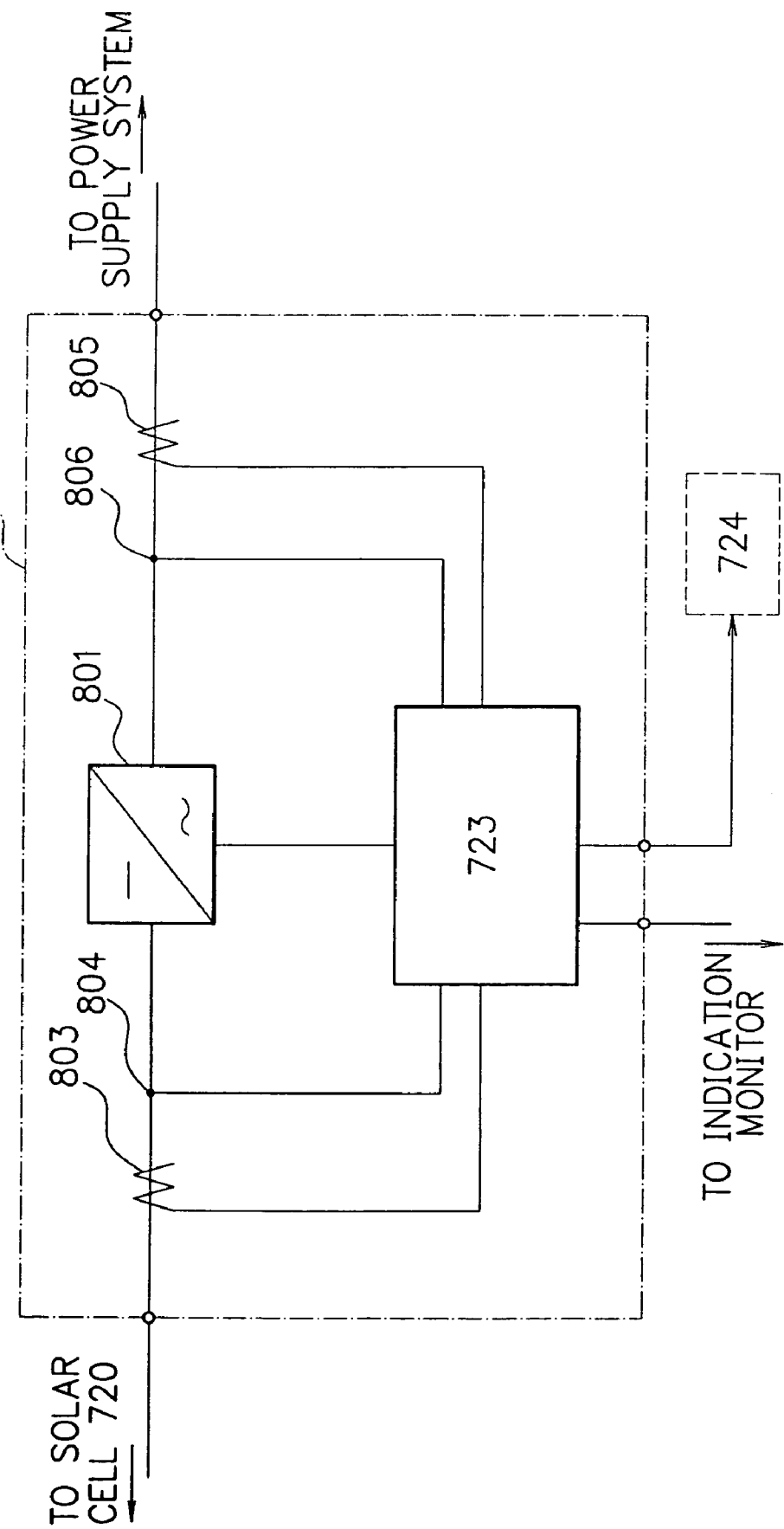

US 7,754,963 B2

SOLAR POWER GENERATION SYSTEM HAVING COOLING MECHANISM

This application is a divisional application of U.S. patent application Ser. No. 09/986,487, filed Nov. 9, 2001.

BACKGROUND OF THE INVENTION

1. Field of the Invention

The present invention relates to a solar power generation system having a cooling mechanism. More particularly, the present invention relates to a solar power generation system in which a solar cell is installed and which is provided with a cooling mechanism capable of cooling said solar cell depending on an output of said solar cell.

2. Related Background Art

In recent years, as an energy source which is safe and does not bring about a load to the environment, a solar power generation system in which a solar cell is used has been spotlighted. However, such a solar power generation system is necessary to be more advantageous in comparison with conventional power generation systems also in terms of the economical viewpoint in order that it can be more widely used. Because of this, various studies have been conducted in order to develop a solar cell having an improved photoelectric conversion efficiency and capable of being produced at a reasonable production cost and which makes it possible to establish a solar power generation system having a high power generation efficiency at a reasonable cost.

Incidentally, in order for a solar cell to have a large output energy, it is important that the solar cell is made to have a large photoelectric conversion efficiency. Besides, it is important to contrive such that the generated energy of the solar cell is increased. In order to increase the generated energy of the solar cell, there is considered, for instance, a measure that the solar cell is maintained at a temperature which is as low as possible. Specifically, in the case where the solar cell is installed outdoors, when the solar cell receives direct sunlight, the temperature thereof is risen, where there is a phenomenon in that the effective power generation efficiency of the solar cell is reduced due to the temperature rise in comparison with that when the solar cell is maintained in a rated state (where the solar cell is maintained at 25° C.). In order to prevent occurrence of this phenomenon, it is necessitated that the solar cell is maintained at a temperature which is as low as possible. In the case where the solar cell is exposed to direct sunlight in summer time, the temperature of the solar cell generally reaches 80° C. or more, where when the solar cell is a silicon series solar cell (such as a crystalline silicon series solar cell or an amorphous silicon series solar cell), the temperature coefficient of the photoelectric conversion efficiency thereof is about –0.4%/° C. (which is meant that the absolute value of the photoelectric conversion efficiency is reduced by about 0.4% per a temperature rise of 1° C.) and because of this, the power generation efficiency thereof is reduced by more than 20%. Therefore, even when a silicon series solar cell having a sufficiently high photoelectric conversion efficiency should be used, unless the silicon series solar cell is adequately cooled, it is difficult for the solar cell to achieve a satisfactory power generation efficiency. Further, in the case where the solar cell is maintained at a relatively high temperature, heat load to the components thereof is increased and accordingly, the durability of the solar cell is deteriorated. Also in view of preventing the durability of the solar cell from being deteriorated, particularly in the case where the solar cell is installed outdoors, it is necessary to cool the solar cell so that the solar cell can be maintained at a temperature which is as low as possible.

Now, in recent years, from the viewpoint of attaining a solar power generation system having a high power generation efficiency at a reasonable cost, a solar power generation system having an optical concentration type solar cell provided therein has started receiving the public attention. In the case where such an optical concentration type solar cell is used, there are advantages such that the number of solar cells, which are the most expensive of the components constituting the solar power generation system, can be diminished. This situation makes it possible to attain a solar power generation system having a high power generation efficiency at a reasonable cost.

In a solar power generation system, even when a relatively small number of optical concentration type solar cells are used, light with a large intensity is impinged into the solar cells to generate a large voltage, where the proportion of the output power energy to the incident light energy, that is, the photoelectric conversion efficiency is improved. Thus, there can be achieved a relatively large power output. Specifically, for instance, when a case wherein a prescribed number of optical concentration type solar cells are arranged on a prescribed area is compared with a case wherein a prescribed number (which is the same as the former number) of solar cells which are not of the optical concentration type are arranged on a prescribed area (which is the same as the former area), the power outputted in the former case is significantly greater than that in the latter case. Even in the former case, in order to achieve a sufficient power output by sufficiently increasing the photoelectric conversion efficiency, it is necessary that an optical focusing system with a high magnification is adopted and a sun-tracking mechanism is provided. However, in this case, the temperatures of the solar cells are more increased in comparison with those when the optical focusing of sunlight is not performed and therefore, it is necessitated to more efficiently cool the solar cells.

In view of the above situation, there has been made a proposal of performing forcible (intentional) cooling for the solar cells in a solar power generation system in order to lower the temperatures of the solar cells. For instance, Japanese Unexamined Patent Publication No. Hei.9(1997)-213980 (hereinafter referred to as JP '980) discloses a forcible cooling means for intentionally cooling the solar cells in a solar power generation system.

The term "forcible cooling means" is meant a means for intentionally cooling an object to be cooled, which is distinguished from a means for cooling said object by way of spontaneous heat radiation or the like.

Particularly, the forcible cooling means disclosed in JP '980 is of the method of performing continuous cooling, where the same energy is used in the forcible cooling for the solar cells regardless of whether solar irradiation is relatively large or small. However, this method has shortcomings such that when the cooling function is designed to conform the time when the solar radiation becomes maximum, excessive energy is consumed when the solar radiation is low and therefore, there entails a disadvantage in that the energy is wasted; and reversely, when the cooling function is designed to conform the time when the solar radiation is weak, there will entail a problem in that the solar cells cannot be sufficiently cooled when the solar radiation is strong.

In order to solve these shortcomings, Japanese Unexamined Patent Publication No. Hei. 5(1993)-83881, Japanese Unexamined Patent Publication No. Hei. 7 (1995)-36556, and Japanese Unexamined Patent Publication No. Hei.

10(1998)-101268 propose a method wherein the temperature of a solar cell to be cooled is detected by a temperature-detecting means and when the detected temperature exceeds a prescribed value, a forcible cooling means such as a fan or the like is actuated to cool the solar cell. However, such a method has shortcomings such that the temperature-detecting means is specially provided and this makes the system costly; when a failure is occurred at the temperature-detecting means, the failure sometimes will cause a failure at the solar cell; and because the cooling effect of the forcible cooling means is always constant, the foregoing problems relating to excess and deficiency of the cooling extent cannot be sufficiently solved.

As a measure to solve such shortcomings as above described, Japanese Unexamined Patent Publication No. Hei. 7(1995)-240532 (hereinafter referred to as JP '532) proposes a method wherein a cooling fan is electrically serialized with a circuit extending from solar cell which are electrically connected with each other and cooling by means of the cooling fan for the solar cells is performed in proportion to a current value generated by the solar cells. However, in general, the cooling effect is not proportional to the power, voltage, current and the like required for the cooling. Therefore, the method described in JP '532 has shortcomings such that when the cooling system is designed such that the cooling effect to the solar cells becomes optimum when the solar cells are in a maximum power generation state, excess or deficiency of the cooling is occurred at an intermediate stage between the case where the solar cells are in a non-power generation state and the case where the solar cells are in a maximum power generation state, where when the solar cells are excessively cooled, the cooling energy is wasted, and when the solar cells are deficiently cooled, excessive temperature rise is occurred in the atmosphere surrounding the solar cells to impart a detrimental effect to the system.

SUMMARY OF THE INVENTION

The present is aimed at solving the foregoing problems found on the solar power generation system in the prior art.

Another object of the present invention is to provide a solar power generation system (or a solar cell power generation system) having a solar cell arranged therein and which is provided with a cooling mechanism having a forcible cooling means (that is, a means for performing intentional cooling) which is capable of realizing a necessary cooling effect with neither excess nor deficiency for the solar cell by way of making use of an attribute of the forcible cooling means and is also capable of minimizing the equipment cost and the operation cost.

A further object of the present invention is to provide a solar power generation system having at least a solar cell provided therein and which is provided with a cooling mechanism, characterized in that said cooling mechanism has a cooling means (a forcible cooling means) for intentionally cooling said solar cell and a memory and operation means for memorizing or operating an optimum cooling and driving state of said cooling means with respect to an output of said solar cell, wherein said cooling means is driven based on an output of said memory and operation means.

In the solar power generation system of the present invention, an output of the solar cell is detected, and with reference to the detected output of the solar cell and a previously presumed cooling attribute of the cooling means, necessary cooling drive by means of the cooling means for the solar cell is performed, where the cooling of the solar cell can be realized with the consumption of the cooling energy to a necessary minimum extent. Now, the term "cooling attribute" is meant a relationship between a cooling effect by the cooling means and a drive magnitude of the cooling means, specifically for instance, a relationship between a cooling effect (a temperature reduction magnitude) by the cooling means and a pumping flow rate (a flow rate of a fluid coolant) in the cooling means as shown in FIG. 5 which will be detailed later).

In the case where a cooling means in which a fluid (liquid) coolant is used is used as the cooling means, the flow state of the fluid coolant is nonlinearly changed depending on the flow velocity and therefore, by adopting such cooling drive method as above described, there are provided significant advantages, typically as will be described below.

(i) Because the output of the solar cell is used for the cooling drive, it is not necessary to use an extra means for detecting the temperature of the solar cell and therefore, the production cost of a solar power generation system can be diminished.

(ii) By performing the drive of the cooling means (the forcible cooling means) with reference to the cooling attribute of the cooling means, the cooling with neither excess nor deficiency can be always performed for the solar cell, where the energy required for forcibly cooling the solar cell can be limited to a necessary minimum extent.

In the solar power generation system of the present invention, to cool the solar cell installed therein by means of the foregoing cooling mechanism is performed typically in a manner as will be described below.

(1) An output of the solar cell is detected,
(2) a magnitude of a rise in the temperature of the solar cell is operated (computed) based on the detected output,
(3) the temperature rise magnitude computed is added to a prescribed estimate temperature of the solar cell to presume a temperature of the solar cell at that time,
(4) a temperature difference between the presumed temperature and a temperature range in which the temperature of the solar cell is intended to control is operated (computed),
(5) a forcible cooling dive magnitude for lowering the temperature difference by way of cooling is operated (computed), and
(6) the cooling means is driven to meet the forcible cooling drive magnitude by means of a control means.

Now, the memory and operation means used in the solar power generation system of the present invention may be independently provided. In the case where a memory and operation means is provided in other component(s) of the solar power generation system, it is possible that said memory and operation means is made to serve also as the memory and operation means used in the cooling mechanism. In this case, the production cost of the solar power generation system can be diminished. As aforesaid other component, in the case where the solar power generation system is connected with a commercial power supply system such that a dump power occurred in the solar power generation system is flown to the commercial power supply system, there can be mentioned a power converter (a so-called inverter) which converts a d.c. power into an a.c. power. and a charge-and-discharge control means (a so-called power controller) which is provided in a direct current power storage means such as a storage battery or the like which is connected to the solar power generation system. Besides, the solar power generation system may be provided with an equipment for observing, memorizing and indicating the power generation state thereof. The equipment in this case is provided with a memory and operation means for controlling the equipment. It is possible that this memory and operation means is made to serve also as the memory and operation means in the foregoing cooling mechanism.

BRIEF DESCRIPTION OF THE DRAWINGS

FIG. 1 is a schematic diagram illustrating the constitution of a principal part of an example of a solar power generation system provided with a solar cell and which has a cooling mechanism including a cooling means for cooling the solar cell in the present invention.

FIG. 8 is a schematic diagram illustrating an example of a circuit constitution for driving the solar cell and cooling the solar cell by means of the cooling means in the solar power generation system shown in FIG. 7.

DESCRIPTION OF THE INVENTION AND PREFERRED EMBODIMENTS

Figure 2:
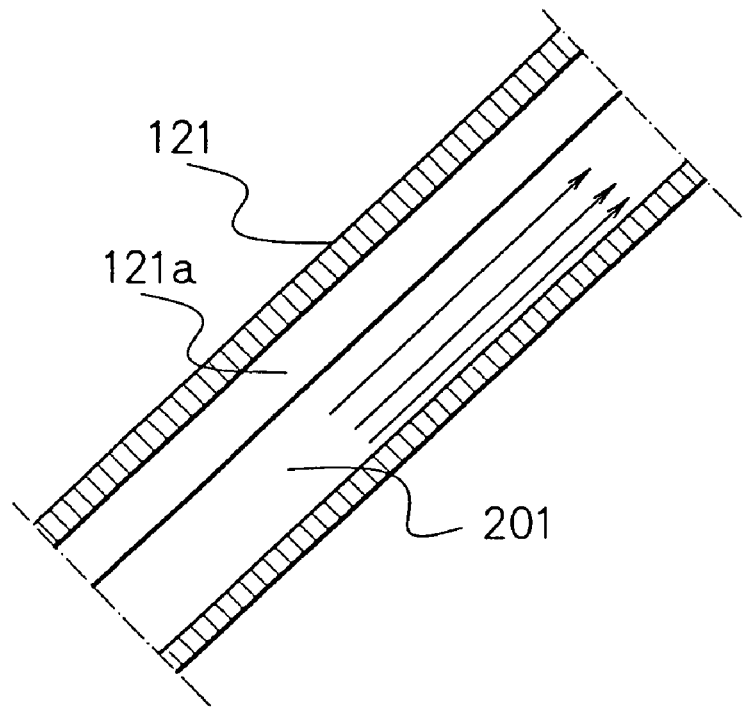
FIG. 2(a) is a schematic view illustrating the structure of a longitudinal section of a principal part of a cooling pipe as the cooling means used in the cooling mechanism of the solar power generation system shown in FIG. 1.
FIG. 2(b) is a schematic view illustrating the structure of a cross section of the cooling pipe shown in FIG. 2(a).
Figure 2:
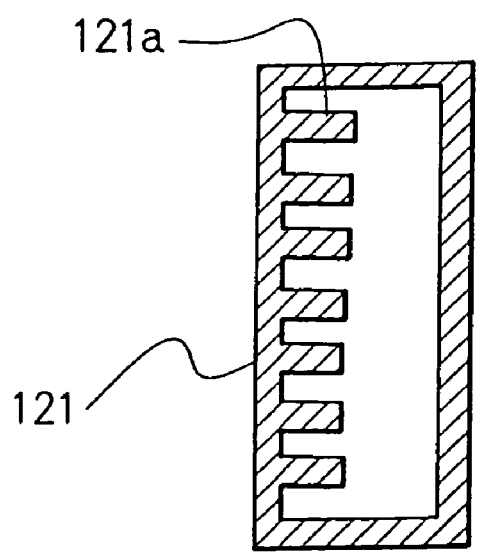

As previously described, the present invention typically provides a solar power generation system comprising at least a solar cell provided therein and which is provided with a cooling mechanism, characterized in that said cooling mechanism has a cooling means for cooling said solar cell and a memory and operation means for memorizing or operating an optimum cooling and driving state of said cooling means with respect to an output of said solar cell, wherein said cooling means is driven based on an output of said memory and operation means.

In the following, description will be made of each of the components of the solar power generation system according to the present invention.

Solar Cell

The solar cell used in the solar power generation system of the present invention comprises a member having a photoelectric conversion element for converting a sunlight energy into an electric energy. Specifically, the solar cell typically comprises a member structured to have one or more photoelectric conversion elements capable of converting a sunlight energy into an electric energy. The solar cell functions to convert incident sunlight into an electric energy (a power) by way of photoelectric conversion and output the electric energy to the outside. As specific examples of such photoelectric conversion element, there can be mentioned photoelectric conversion elements comprising adequate semiconductor materials. Such semiconductor material can include crystalline semiconductor materials, amorphous semiconductor materials, and compound semiconductor materials such as GaAs, CdTe, CuInSe$_2$, and the like. These are not limitative. Any other photoelectric conversion elements can be optionally used as long as they exhibit the foregoing function.

In the case where an optical concentration type solar cell as the solar cell used in the present invention, only by means of a portion which converts a sunlight energy into an electric energy, namely a photoelectric conversion portion (hereinafter, this will be occasionally called a solar cell in a narrow sense), a power generation operation cannot be sufficiently performed in general. It is necessitated to use an optical focusing system for converging light. A combination of said photoelectric conversion portion and said optical focusing system will be hereinafter called a solar cell.

As the optical focusing system, any known optical focusing systems can be optionally used. As specific examples of such optical focusing system, there can be mentioned a refracting optical system in which a simple lens or a thin type Fresnel lens is used, a refracting optical system in which a reflecting mirror comprising a parabolic mirror is used, and a composite optical system comprising these refracting systems.

Cooling Means

As the cooling means used in the solar power generation system of the present invention, it is possible to adopt a cooling system in which air is used as the coolant or a cooling system in which a fluid is used as the coolant.

As specific examples of such cooling system in which air is used as the coolant, there can be mentioned a cooling system in which one or more cooling fans are used, and a cooling system in which a heat exchanger is used.

As specific examples of such cooling system in which a fluid is used as the coolant, there can be mentioned a cooling system in which flowing water is flown to the entire face of an object to be cooled, a cooling system in which a fluid coolant is introduced into a cooling pipe and is circulated by means of a circulating pump, and a cooling system in which cooling of a fluid coolant is intentionally conducted using a heat exchanger.

Besides, a cooling system in which heat radiation is performed using a solid thermo-element such as a Peltier element without using a coolant can be used as the cooling means used in the solar power generation system of the present invention.

The cooling means in the present invention includes a cooling control means. As the cooling control means, it is possible to adopt an appropriate control means capable of electrically or mechanically control the cooling means. As a specific example of such control means, there can be mentioned an electric circuit capable of applying a voltage or a current to a cooling fan, a feed pump of feeding a fluid coolant and the like, or a solid thermo-element such as a Peltier element as the cooling means depending on an electric signal from the cooling means. It is possible that the cooling control means is provided independently from the cooling means or it is provided so as to integrate with the cooling means.

Besides, it is possible that the cooling control means is provided together with the memory and operation means in an equipment in which the memory and operation means is provided.

Memory and Operation Means

The memory and operation means used in the solar power generation system of the present invention has functions of memorizing values or computation equations relating to attributes (characteristics) as will be described below and affording output values corresponding to input values. Specifically, the memory and operation means may have, for instance, a mechanism comprising an arithmetic element such as a microcomputer or the like having a memory element such as a nonvolatile memory or/and a cam mechanism, capable of memorizing a given characteristic as a geometry and inputting and outputting a physical positional information. Besides, the memory and operation means may have a mechanism capable of inputting an electric signal relating to a valve form of an electromagnetic valve which is opened or closed depending on a demand electric signal and converting said inputted electric signal into a flow rate of a coolant (a fluid coolant).

In any case, it is preferred that the memory and operation means has a function to retain information of a standard temperature which is influenced to the performance of the cooling mechanism which will be detailed later. The term "standard temperature" is meant a temperature to be a standard in order to estimate the magnitude of a rise in the temperature of the solar cell by way of solar radiation at a given location where the solar cell is installed. Specifically, when the purpose of the cooling is directed to an improvement in the photoelectric conversion efficiency of the solar cell installed at a given location, an average temperature of the atmosphere of said location which surrounds the solar cell corresponds said standard temperature. When the purpose of the cooling is directed to preservation of the internal components of the solar power generation system installed at a given location, a maximum temperature of the atmosphere of said location which surrounds the solar power generation system corresponds aforesaid standard temperature.

Separately, when neither an average atmospheric temperature nor a maximum atmospheric temperature with respect to the installation location throughout the year but an average atmospheric temperature and a maximum atmospheric temperature with respect to the installation location in each of divided periods (for instance, months) of the year are memorized in the memory and operation means, and the memory and operation means is made have a function to timely output an electric signal of said average atmospheric temperature and said maximum atmospheric temperature depending on a demand electric signal, the control of the cooling drive thereafter can be more precisely performed.

Output Detection Means

The solar power generation system of the present invention is provided with an output detection means for detecting an output of the solar cell in the system and is also provided with a drive means for driving the solar cell. The drive means includes a drive control means for controlling the driving of the solar cell by means of the drive means. The output detection means is necessary to have a function to transmit an output (an output value) of the solar cell which is detected by the output detection means. As the output value of the solar cell, it is the most appropriate to use an energy value outputted from the solar cell, that is, an output power corresponding to a product of a current and a voltage respectively from the solar cell. However, in the simple alternative, it is possible to use a current value from the solar cell as the above output value.

As the output detection means, it is possible to use a mechanism capable of outputting a voltage value developed across an electrical resistance electrically serialized with an output circuit of the solar cell. In order to more precisely detect the output value, it is possible to use a mechanism capable of operating and outputting a product of a voltage value developed across the solar cell and said voltage value developed across the electrical resistance.

Besides, it is possible to use a mechanism capable of outputting an adequate electric signal in a power conversion means (specifically for instance, an inverter) for converting a d.c. output from the solar cell into an a.c. voltage as the output detection means. In this case, it is possible that the output detection means is made such that it is included in the power conversion means or the power conversion means is made such it serves also as the output detection means. Alternatively, it is possible to use an a.c. power meter for measuring an a.c. power after the power conversion as the output detection means.

The cooling mechanisms in the solar power generation system is constituted by such means as described in the above. In the solar power generation system of the present invention, to cool the solar cell installed therein by means of the cooling mechanism is performed typically in a manner as will be described below.

(1) An output of the solar cell is detected,
(2) a magnitude of a rise in the temperature of the solar cell is operated (computed) based on the detected output,
(3) the temperature rise magnitude computed is added to the foregoing standard temperature (that is, a prescribed estimate temperature of the solar cell) to presume a temperature of the solar cell at that time,
(4) a temperature difference between the presumed temperature and a temperature range in which the temperature of the solar cell is intended to control is operated (computed),
(5) a forcible cooling dive magnitude for lowering the temperature difference by way of cooling is operated (computed), and
(6) the cooling means is driven to meet the forcible cooling drive magnitude by means of the cooling control means.

By means of the cooling mechanism which behaves as described in the above, it is possible to perform desired cooling drive for the solar cell in the solar power generation system. In addition, by retaining the standard temperature, which becomes a standard in the above operation (computation), in the memory and operation means, it is possible to prevent occurrence of excess or deficiency in the cooling drive.

In the above description, for the simplification purpose, explanation has been made such that an independent means is provided for each function. However, it is possible that a simple means is made to achieve a plurality of functions.

In the following, the features and advantages of the present invention will be described in more detail with reference to examples. It should be understood that these examples are only for illustrative purposes and are not intended to restrict the scope of the present invention.

Example 1

This example describes an embodiment of a solar power generation system provided according to the present invention.

FIG. 1 is a schematic diagram illustrating the constitution of a principal part of an embodiment of a solar power generation system in which an optical concentration type solar cell is used, which is provided according to the present invention.

In FIG. 1, reference numeral 101 indicates the sun and reference numeral 120 indicates a solar cell. When sunlight from the sun 101 is impinged into the solar cell 120, the sunlight is converted into a power (a d.c. power) by way of photoelectric conversion by the solar cell 120, followed by being outputted to the outside though a power output line 107. The solar power generation system in this example is provided with a power conversion means 108 for performing system interconnection with a commercial power supply system (not shown). The d.c. power outputted from the solar cell 120 through the power output line 107 is inputted into the power conversion means 108, where the d.c. power is converted into an a.c. power, followed by being flown into the commercial power supply system.

Reference numeral 121 indicates a cooling pipe which is provided at the rear face of the solar cell 120 such that the cooling pipe 121 is in contact with the rear face of the solar cell 120. The inside of the cooling pipe 121 is filled with a coolant (a water containing 5 wt. % of polyethylene glycol): where the coolant is circulated by means of a circulating pump 122. Now, the heat of the solar cell 120 which is imparted by the sun conducts the circumferential wall of the cooling pipe 121 from the rear face of the solar cell 120, followed by conducting the coolant in the cooling pipe 121. At this time, as the coolant is forming a circulating flow in the cooling pipe 121, the heat conducted to the coolant in the cooling pipe 121 does not stay at the same position but it is carried by the moving coolant and dissipated into the atmosphere through the circumferential wall face of a portion of the cooling pipe 121 which is distant from the solar cell 120. Accordingly, a rise in the temperature of the solar cell 120 can be controlled by forming such heat path at a low thermal resistance. The drive of the pump 122 can be adequately controlled by means of a drive control means 124 comprising an electric circuit (not shown) which is connected to the pump 122. The electric circuit as the drive control means 124 is designed so that the revolution speed of the pump 122 can be increased or decreased depending on an electric signal inputted into the electric circuit. In FIG. 1, reference numeral 130 indicates a cooling means. The cooling means 130 comprises the cooling pipe 121, the circulating pump 122 and the drive control means 124.

As shown in FIG. 1, a power detection means 109 is provided on the way of the power output line 107 between the solar cell 120 and the power conversion means 108. Here, it is possible to monitor a current generated in the solar cell 120 by electrically serializing an electrical resistance with a prescribed portion of the power output line 107 between the solar cell 120 and the power detection means 109 and taking out a voltage developed across the electric resistance.

An output of the power detection means 109 is transmitted to a memory and operation means 123 which is electrically connected to the power detection means 109 and also to the drive control means 124 of the cooling means 130.

The memory and operation means 123 comprises a microcomputer having a nonvolatile memory. The memory and operation means 123 functions to operate an adequate drive magnitude of the cooling means 130 based on the output transmitted from the power detection means 109 and in accordance with a logic which will be described later and transmit an electric signal of information of the drive magnitude operated by the memory and operation means to the drive control means 124. The drive control means 124 drives the pump 122 in accordance with the electric signal transmitted from the memory and operation means 123.

As above described, the cooling means 130 performs the driving depending on an output of the solar cell 120.

Description will be made of the attribute which the cooling means 130 possesses and a temperature difference. cased due to the heat with respect to the solar cell 120, prior to explaining about the logic upon operating the above-described drive magnitude.

FIG. 2(a) is a schematic view illustrating a longitudinal section of a cooling pipe as an example of the cooling pipe 121 shown in FIG. 1, in which shown is a portion of said cooling pipe which is in contact with the rear face of the solar cell (120) [see, FIG. 1]. FIG. 2(b) is a schematic view illustrating a cross section of the cooling pipe shown in FIG. 2(a).

In FIGS. 2(a) and 2(b), reference numeral 121 indicates the foregoing cooling pipe, reference numeral 121a a heat radiation accelerating face shaped in a fin form which is provided in the cooling pipe 121, and reference numeral 201 a fluid coolant which is flown in a direction indicated by an arrow mark in the cooling pipe 121.

The fluid coolant 201 is flown in the cooling pipe 121 while being contacted the heat radiation accelerating face 121a. This refrains a rise in the temperature of the rear face of the solar cell (not shown) which is in contact with the circumferential wall of the cooling pipe 121.

Figure 3:
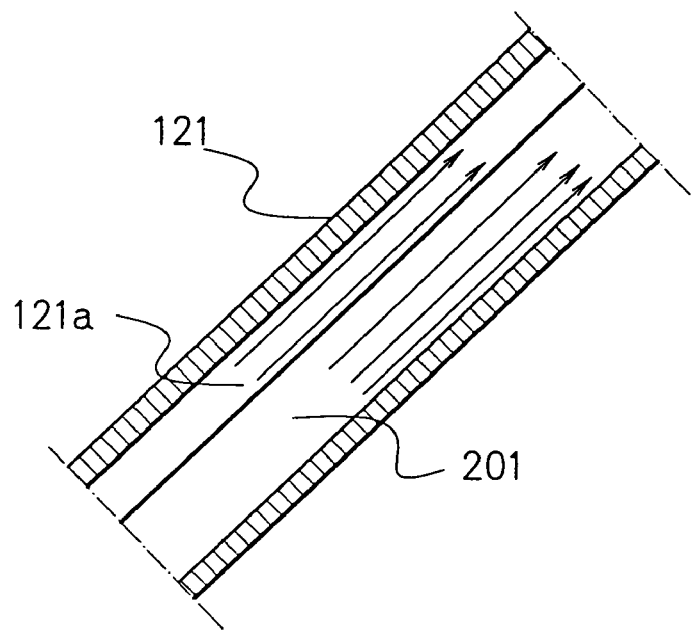
FIG. 3 is a schematic cross-sectional view for explaining a laminar flow state of a fluid coolant used in the cooling means shown in FIGS. 2(a) and 2(b).

FIG. 3 is a schematic view illustrating a flow state of the fluid coolant 201 in the cooling pipe 121 when the flow velocity of the fluid coolant is relatively small.

Figure 4:
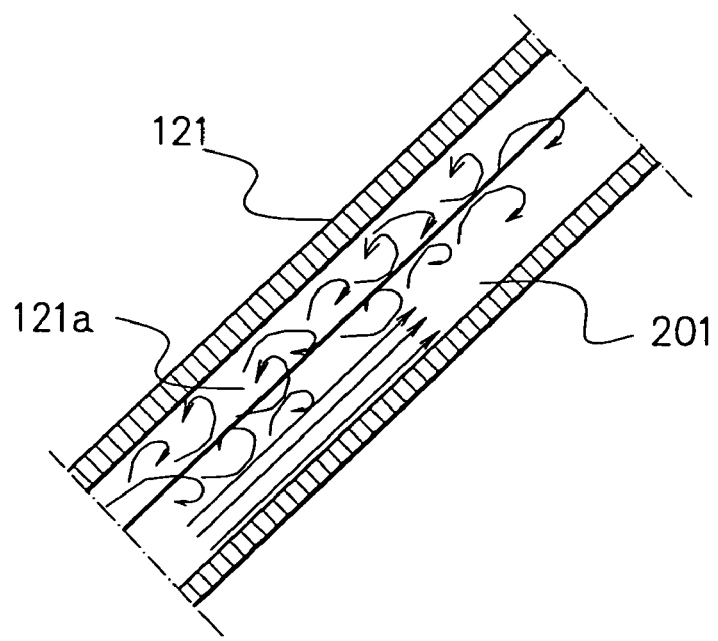
FIG. 4 is a schematic cross-sectional view for explaining a turbulent flow state of a fluid coolant used in the cooling means shown in FIGS. 2(a) and 2(b).

As shown in FIG. 3, when the flow velocity of the fluid coolant 201 in the cooling pipe 121 [see, FIG. 2(a)] is relatively small, the flow of the fluid coolant 201 forms a laminar flow. However, when the flow velocity of the fluid coolant 201 in the cooling pipe 121 [see, FIG. 3] is increased, the laminar flow of the fluid coolant is changed into a turbulent flow as shown in FIG. 4. This is a phenomenon which will occur when the inertia force in a flow is increased relatively against the viscose force in the flow. Incidentally, it is generally recognized that such phenomenon will be occurred when the ratio between a value of the inertia force and a value of the viscose force, namely, the so-called Reynolds number, is increased in proportion to the flow velocity and that the change from the laminar flow into the turbulent flow will be occurred when the Reynolds number is about 3000.

Figure 5:
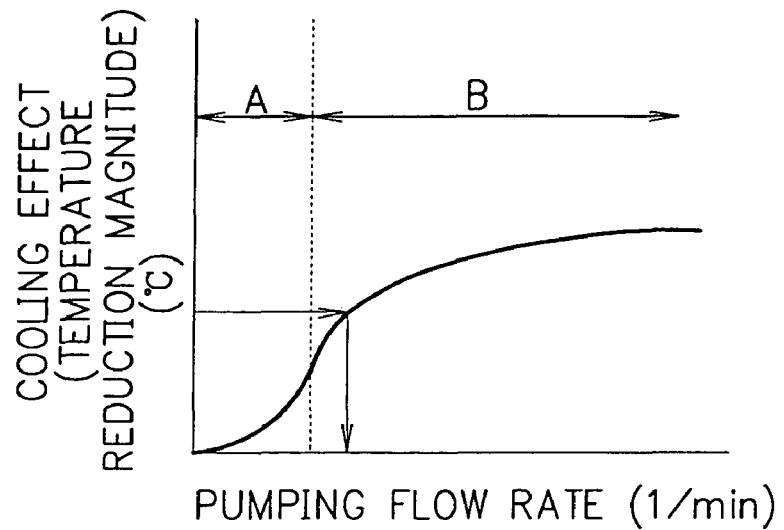
FIG. 5 is a graph for explaining a cooling attribute by means of the cooling means in the solar power generation system shown in FIG. 1.

When consideration is made in view of the migration of the heat in the system where the solar cell 120 and the cooling pipe 121 in which the fluid coolant 201 is circulated are involved, it can be said that because of the change from the laminar flow into the turbulent flow as above described, the transfer coefficient of the heat (from the rear face of the solar cell 120) which conducts the fluid coolant 201 through the circumferential wall of the cooling pipe 121 is improved by more than one figure. The heat radiation performance in this system is shown FIG. 5. FIG. 5 is a graph showing a relationship between the flow rate (the pumping flow rate) of the fluid coolant and the cooling effect (the temperature reduction magnitude of the solar cell). In FIG. 5, A indicates a laminar flow region, and B indicates a turbulent flow region.

Separately, there is a given relationship also with respect to a rise in the temperature of the solar cell (120) to the solar irradiation. All of the sunlight radiated to the solar cell excluding light reflected and light converted into a power by the solar cell is entirely converted into a heat energy (q)(a heat flux) at the surface of the solar cell. There is a relationship expressed by the following equation between the quantity of the q, the overall heat transfer coefficient K (the heat propagation tendency of the heat transfer system from the solar cell to the outside) and a temperature difference $\Delta\theta$ between the temperature of the heat generation source (that is, the solar cell) and that of the atmosphere of the outside.

$$q = K \times \Delta\theta$$

Figure 6:
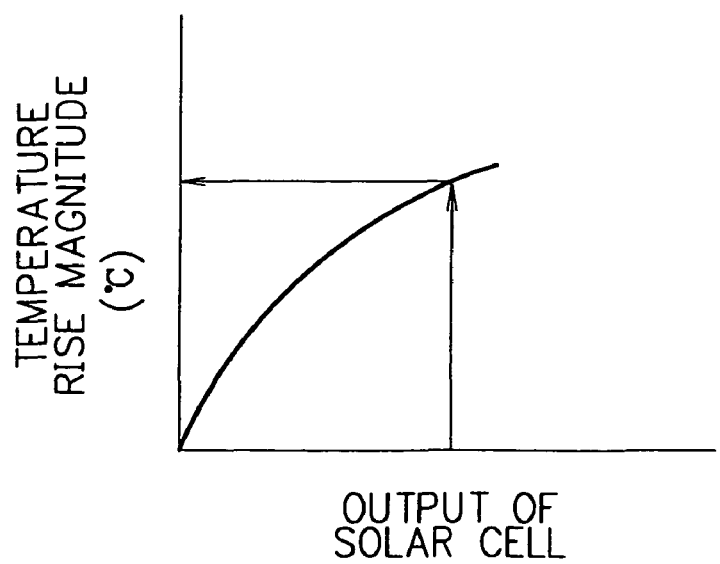
FIG. 6 is a graph for explaining a temperature-rising attribute in the solar power generation system shown in FIG. 1.

Accordingly, it is understood that the temperature difference $\Delta\theta$ which is occurred is proportional to the solar irradiation. There is substantially the same relationship also with respect to the solar irradiation and the quantity of the power generated by the solar cell. Therefore, it can be thought that there is a substantially direct proportional relationship between the power generation quantity and the temperature difference $\Delta\theta$. In this case, it can be thought that the calorific capacity of the outside atmosphere is infinite, and therefore, it can be thought that the temperature difference $\Delta\theta$ corresponds the magnitude of a rise in the temperature of the solar cell to the temperature of the atmosphere surrounding the solar cell. FIG. 6 is a graph showing this relationship. (When the temperature rise magnitude of the solar cell is increased, the heat convection is promoted to improve the heat radiation performance and accordingly, there is provided a curve which somewhat reaches the ceiling.)

The above-described relationships are memorized in the memory and operation means 123 and they are used for the determination of the magnitude of the cooling drive in accordance with such a logic as will be described in the following. Particularly, a table corresponding to an ordinarily usable region derived from the graph shown in FIG. 5 and a table corresponding to an ordinarily usable region derived from the graph shown in FIG. 6 are previously memorized in the nonvolatile memory of the memory and operation means 123. In addition, a standard temperature $\theta s$ and a standard use temperature $\theta 1$ (that is, an atmospheric temperature at which the solar cell (120) is used) are also previously memorized in the nonvolatile memory of the memory and operation means 123. The standard temperature $\theta s$ in this example is the atmospheric temperature of the location where the solar cell (120) is installed. As for the standard temperature (that is, the average atmospheric temperature of the installation location of the solar cell for every month) and the standard use temperature $\theta 1$, a maximum use temperature (a maximum temperature of the atmosphere where the solar cell (120) is used) is used.

The memory and operation means 123 has a clocking function. Based on a date obtained from the clocking function of the memory and operation means 123, as a temperature of the atmosphere where the solar cell is installed and which is used as a standard at the present time, a standard temperature $\theta s$ of the current month is selected. Then, with reference to an output (P) of the solar cell (120) which is detected by the power detection means 109 and is transmitted to the memory and operation means 123 and with reference to concretized information of the table concerning the relationship shown in FIG. 6 which is memorized in the memory and operation means, there is estimated a temperature rise magnitude $\Delta\theta$ of the solar cell (120). In the estimation of the temperature rise magnitude $\Delta\theta$, there is adopted an interpolation method based on the concretized information of the table concerning the relationship shown in FIG. 6. On the basis of the resultant the temperature rise magnitude $\Delta\theta$, there is operated a necessary temperature reduction magnitude $\theta c$ for the solar cell in accordance with the following equation which is previously memorized in the memory and operation mean 123.

$$\theta c = \theta s + \Delta\theta - \theta 1$$

Finally, based on the operated necessary temperature reduction magnitude $\theta c$ and with reference to concretized information of the table concerning the relationship shown in FIG. 6 which is previously memorized in the memory and operation means 123, there is operated a necessary cooling drive magnitude Rc for the cooling mean.

The memory and operation means 123 transmits an electric signal of the necessary cooling drive magnitude Rc to the drive control means 124. And based on the electric signal thus transmitted, the drive control means 124 actuates the circulating pump 122, whereby the solar cell 120 is cooled to and maintained at a desired temperature which is less than the maximum use temperature.

In this way, depending on a solar irradiance, there can be performed the minimum cooling drive for the solar cell 120 so that the temperature of the solar cell does not exceed the maximum use temperature.

Example 2

This example describes an embodiment of an optical concentration type solar power generation system.

Figure 7:
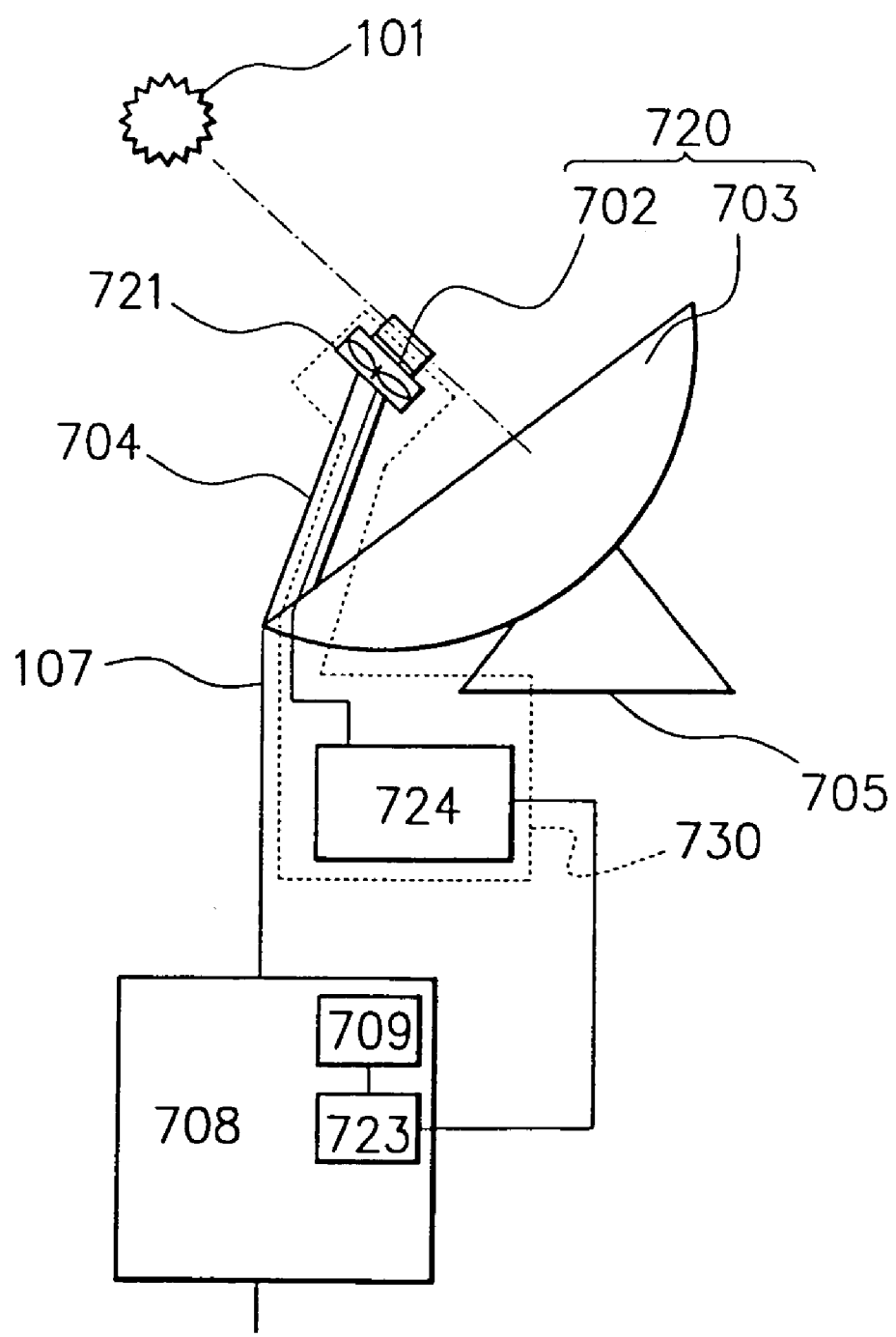
FIG. 7 is a schematic diagram illustrating the constitution of an example of an optical concentration type solar power generation system provided with a solar cell and which has a cooling mechanism including a cooling means for cooling the solar cell in the present invention.

FIG. 7 is a schematic diagram illustrating the constitution of a principal part of an embodiment of an optical concentration type solar power generation system provided according to the present invention.

In the optical concentration type solar power generation system shown in FIG. 7, a combination of a photoelectric conversion portion and a reflecting mirror is used as a solar cell, and an output detection means is provided in a power conversion means. In the optical concentration type solar power generation system, there is a large fear in that cooling deficiency for the photoelectric conversion portion provided therein leads to damage the photoelectric conversion portion. Therefore, it is essential to perform adequate cooling for the photoelectric conversion portion.

In FIG. 7, for the components having the same function as those have in FIG. 1, the same reference numerals as in FIG. 1 are added. Now, in FIG. 7, reference numeral 101 indicates the sun. Reference numeral 702 indicates a photoelectric conversion portion. Sunlight from the sun 101 is impinged into the photoelectric conversion portion 702, where the impinged sunlight is converted into a power (a d.c. power). Reference numeral 703 indicates a reflecting mirror (a light converging optical system) which functions to guide incident sunlight from the sun 101 to the photoelectric conversion portion 702 while increasing the energy density of the light. The reflecting mirror 703 is connected to the photoelectric conversion portion 702 through a retaining means 704 fixes the reflecting mirror 703 and fixes a relative position between the reflecting mirror and the photoelectric conversion portion 702. Here, a combination 720 of the photoelectric conversion portion 702 and the reflecting mirror 703 functions to convert incident sunlight into a power (a d.c. power) and therefore, the combination 720 can be called a solar cell. The reflecting mirror 703 is arranged on a frame 705 having a driving means (not shown) for driving the reflecting mirror 703. Accordingly, it is made such that the reflecting mirror 703 can be driven by actuating the driving means to optionally change the relative position with the frame 705 so that the solar cell 720 can always track the sun following the movement thereof. This function is built-in with reference to the two axes (the declination, the hour angle) which define the position of the sun.

Reference numeral 709 indicates an output detection means. The output detection means 709 functions in the same way as the output detection means (109) in Example 1 does. However, the functioning manner of the output detection means 709 is somewhat different from that of the output detection means (109) in Example 1. Therefore, description will be made about this.

In Example 1, the output detection means (109) is electrically serialized with the output transmission circuit and is provided separately from other components, and it includes the electrical resistance for detecting a current value. On the other hand, in this example, the output detection means 709 is provided such that it is included in a power conversion means 708. Similarly, in Example 1, the memory and operation means (123) is provided separately from other components. But in this example, a memory and operation means 723 is provided such that it is included in the power conversion means 708. Detailed constitution of this is shown in FIG. 8. In FIG. 8, reference numeral 708 indicates the above-described power conversion means. Reference numeral 801 indicates a power conversion circuit as a principal portion of the power conversion means 708. Specifically, the power conversion circuit 801 comprises a combination of a rectifier circuit and a high frequency coil so as to make it possible that a d.c. voltage and a current are subdivided, followed by being rectified to convert into a desired constant voltage alternative current waveform.

The d.c. power from the photoelectric conversion portion 702 is introduced into the power conversion means 801 through a connection portion comprising a power output line 107 between the photoelectric conversion portion 702 and the power conversion means 801, where the d.c. power is converted into a desired a.c. power, followed by being transmitted to a commercial power supply system. At this time, in order to control the power conversion, the current and voltage on the d.c. side are introduced into a microcomputer provided in the memory and operation means 723 respectively through a current transformer 803 and a connection point 804. The microcomputer provided in the memory and operation means 723 performs the control the above power conversion and also performs the control of a cooling means. Similarly, the current and voltage on the a.c. side are introduced into the memory and operation means 723 respectively through a current transformer 805 and a connection point 806.

The memory and operation means 723 functions to use related various information for controlling the power conversion circuit 801. Besides, the memory and operation means 723 is used for various purposes, for instance, for controlling the performance of the solar power generation system, e.g. the actuation or the termination of the solar power generation system, for detecting wrong working of the solar power generation system, for indicating a momentary power generation quantity in the solar power generation system, and for operating and indicating a cumulative power generation quantity. Thus, the d.c. power or the a.c. power which is momently generated can be readily outputted to the outside. In this case, it can be said that the output detection means 709 in FIG. 8 is meant to include the current transformer (803, 805), the connection point (804, 806), and the connection line in the power conversion means 708, and the output detection means 709 is present while sharing the function with the power conversion means 708. Similarly, it can be said that the memory and operation means 723 is present while sharing the function with the power conversion means 708.

The power conversion means 708 and the output detection means 709 which work in this way are arranged as shown in FIG. 7, and an electric signal concerning the quantity of a d.c. power generated by the solar cell 720 is imparted to the memory and operation means 723 in the form of a product of the current and the voltage. At this time, it is a matter of course that information of the a.c. power can be also imparted to the memory and operation means 723.

Now, in this example, as the cooling means, an air cooling system (which is different from a cooling system using a fluid coolant) is used. Specifically, the air cooling system comprises a cooling fin (not shown) which is provided in close contact with the rear face of the photoelectric conversion portion 702 and a fan 721 which is also provided at the rear face of the photoelectric conversion portion 702 as shown in FIG. 7, where by supplying a cooling wind to the cooling fin by the fan 721, the photoelectric conversion portion 702 is cooled. The drive of the fan 721 is controlled by means of a drive control means 724. The drive control means 724 has an electric circuit for driving the fan 721, and it is designed such that the revolution speed of the fan 721 can be increased or decreased depending on an electric signal inputted into the electric circuit. Reference numeral 730 indicates a cooling means. The cooling means 730 is meant to include the foregoing cooling fin, the fan 721, and the drive control means 724. The memory and operation means 723 functions to operate an adequate cooling drive magnitude for the cooling means 730 based on an output from the output detection means and in accordance with such logic as described in Example 1 and transmit an electric signal of the operated cooling drive magnitude to the drive control means 724. The drive control means 724 functions to derive the fan 721 in accordance with the transmitted electric signal, whereby the photoelectric conversion portion 702 is cooled to and maintained at a temperature which is less than the maximum use temperature.

Also in the case of the air cooling in this example, there is observed a nonlinear type cooling performance as well as in Example 1. Hence, in the same manner as in Example 1, it is possible to perform optimum fan-driving. Detailed description of the manner of obtaining an optimum drive magnitude in this example is omitted because the manner is the same as that described in Example 1.

Incidentally, in Example 1, the average atmospheric temperature for every month is used as the standard temperature. In this example, it is appropriate to use a maximum atmospheric temperature for every month as the standard temperature in view of preventing the equipments from being damaged.

As will be understood from the above description, the present invention affords various significant advantages.

That is, in the solar power generation system of the present invention, because necessary cooling drive is performed for the solar cell in the solar power generation system based on the detected output of the solar cell and the previously estimated cooling attribute of the cooling means, the consumption of a cooling energy to a necessary and minimum extent can be realized. Particularly in the case where the cooling for the solar cell is performed by means of the cooling means in which the fluid coolant is used, because the flow state of the fluid coolant is nonlinearly changed depending on the velocity of the fluid coolant, the significant energy saving effect can be attained.

Specifically, according to the present invention, there are afforded the following advantages.

(1) Because the output of the solar cell is used for the cooling drive for the solar cell, it is not necessary to use an extra means for detecting the temperature of the solar cell. This makes it possible to diminish the production cost of a solar power generation system.

(2) Because the drive of the cooling means for cooling the solar cell is performed so as to meet the cooling attribute of the cooling means, the cooling with neither excess nor deficiency can be always performed for the solar cell, and the energy required for the cooling can be refrained to a necessary minimum extent.

(3) Because the memory and operation means has the clocking function and memorizes the standard temperature for every time point, by driving the cooling means so as to comply with the standard temperature at a given time point, the cooling control with a high precision can be performed for the solar cell and the energy saving can be realized.

(4) By providing the output detection means for detecting the output of the solar in the power conversion means, it is possible to diminish the production cost of a solar power generation system. Similarly, by providing the memory and operation means in the power conversion means, it is possible to diminish the production cost of a solar power generation system.

(5) As a whole, because the production cost of the cooling system can be diminished and the energy required for cooling the solar cell can be refrained to a necessary minimum extent, the cost for generating a power by the solar power generation system can be diminished.

What is claimed is:

1. A solar power generation system comprising at least a solar cell and a cooling mechanism, the cooling mechanism comprising:
   a cooling means for cooling the solar cell;
   a memory means for memorizing an optimum cooling and driving state of the cooling means with respect to an output of the solar cell, the memory means including a microcomputer having a nonvolatile memory; and
   an operation means for operating the optimum cooling and driving state of the cooling means with respect to the output of the solar cell,
   wherein the memory means comprises a plurality of previously determined standard temperature values for an atmosphere where the solar cell is installed, each of the plurality of standard temperature values corresponding to a respective one of a plurality of predetermined time points of the year,
   wherein the operation means comprises a clocking function and operates the cooling means in accordance with a selected one of the plurality of standard temperature values from the memory means for a current time point at the installation location of the solar cell,
   wherein the cooling mechanism further comprises a power detection means for detecting an output power of the solar cell, and
   wherein the operation means estimates a magnitude of a rise in the temperature of the solar cell based on the detected output power of the solar cell and based on the selected one of the plurality of standard temperature values.

2. The solar power generation system according to claim 1, wherein the output of the solar cell is an output power from the solar cell or an output current from the solar cell.

3. The solar power generation system according to claim 1, wherein the cooling means is a cooling means in which a fluid coolant is used.

4. The solar power generation system according to claim 1, wherein the solar power generation system has a power conversion means for the output of the solar cell, and wherein the memory means and the operation means are provided such that the memory means and the operation means are included in the power conversion means.

5. The solar power generation system according to claim 1, wherein the solar power generation system has a power conversion means for the output of the solar cell and an output detection means for the output of the solar cell, and wherein the output detection means is provided such that the output detection means is included in the power conversion means.

6. The solar power generation system according to claim 1, wherein the power generation system has a mechanism for tracking the sun.

7. A solar power generation system comprising at least a solar cell and a cooling mechanism, the cooling mechanism comprising:
   a cooling unit constructed to cool the solar cell;
   a memory unit constructed to memorize an optimum cooling and driving state of the cooling unit with respect to an output of the solar cell, the memory unit including a microcomputer having a nonvolatile memory; and
   an operation unit constructed to operate the optimum cooling and driving state of the cooling unit with respect to the output of the solar cell,
   wherein the memory unit comprises a plurality of previously determined standard temperature values for an atmosphere where the solar cell is installed, each of the plurality of standard temperature values corresponding to a respective one of a plurality of predetermined time points of the year,
   wherein the operation unit comprises a clocking function and is constructed to operate the cooling unit in accordance with a selected one of the plurality of standard temperature values from the memory unit for a current time point at the installation location of the solar cell,
   wherein the cooling mechanism further comprises a power detection unit constructed to detect an output power of the solar cell, and
   wherein the operation unit estimates a magnitude of a rise in the temperature of the solar cell based on the detected output power of the solar cell and based on the selected one of the plurality of standard temperature values.

* * * * *